(12) United States Patent
Guo et al.

(10) Patent No.: US 10,034,414 B2
(45) Date of Patent: Jul. 24, 2018

(54) MODULAR DATA CENTER

(71) Applicant: ZTE CORPORATION, Shenzhen (CN)

(72) Inventors: Yulong Guo, Shenzhen (CN); Jiangang Weng, Shenzhen (CN); Jun Wan, Shenzhen (CN); Fan Liu, Shenzhen (CN)

(73) Assignee: Xi'An Zhongxing New Software Co., Ltd., Xi'An (CN)

( * ) Notice: Subject to any disclaimer, the term of this patent is extended or adjusted under 35 U.S.C. 154(b) by 0 days.

(21) Appl. No.: 15/320,436

(22) PCT Filed: Dec. 2, 2014

(86) PCT No.: PCT/CN2014/092817
§ 371 (c)(1),
(2) Date: Apr. 10, 2017

(87) PCT Pub. No.: WO2015/192607
PCT Pub. Date: Dec. 23, 2015

(65) Prior Publication Data
US 2017/0238443 A1    Aug. 17, 2017

(30) Foreign Application Priority Data

Jun. 20, 2014    (CN) .......................... 2014 1 0281149

(51) Int. Cl.
*H05K 7/20* (2006.01)
*H05K 7/14* (2006.01)
(Continued)

(52) U.S. Cl.
CPC ....... *H05K 7/20709* (2013.01); *A62C 35/645* (2013.01); *E04H 5/02* (2013.01);
(Continued)

(58) Field of Classification Search
CPC ........... H05K 7/20745; H05K 7/20827; H05K 7/20836; H05K 7/20736; H05K 7/1488;
(Continued)

(56) References Cited

U.S. PATENT DOCUMENTS 6,516,954 B2 * 2/2003 Broome ................. H05K 7/186
                                                          211/26
7,992,402 B2 * 8/2011 VanGilder .......... H05K 7/20745
                                                         62/259.2
(Continued)

FOREIGN PATENT DOCUMENTS

CN          103471185        12/2013
CN          203340497        12/2013
(Continued)

OTHER PUBLICATIONS

International Search Report for PCT/CN2014/092817, English Translation attached to original, Both completed by the Chinese Patent Office dated Mar. 6, 2015, All together 6 Pages.

*Primary Examiner* — James Wu
*Assistant Examiner* — Michael Matey
(74) *Attorney, Agent, or Firm* — Plumsea Law Group, LLC (57) ABSTRACT

A modular data machine room includes a data cabinet subsystem, a cooling subsystem and a power distribution subsystem. The data cabinet subsystem includes two columns of data cabinet groups, and each column of data cabinet group includes at least one data cabinet. The cooling subsystem includes at least one cooling unit, and the cooling unit is arranged in the two columns of data cabinet groups. Each data cabinet and cooling unit is connected with the power distribution subsystem through an interface. The machine room further includes a sealing subsystem, which seals a cold/hot channel between the two columns of data (Continued)

cabinet groups. The machine room has a short construction period and a high cooling efficiency.

6 Claims, 7 Drawing Sheets

(51) Int. Cl.
    *A62C 35/64* (2006.01)
    *E04H 5/02* (2006.01)
    *F24F 13/02* (2006.01)
    *E04H 5/00* (2006.01)

(52) U.S. Cl.
    CPC ........... *F24F 13/02* (2013.01); *H05K 7/1491* (2013.01); *H05K 7/1494* (2013.01); *E04H 2005/005* (2013.01)

(58) Field of Classification Search
    CPC ............. H05K 7/2079; H05K 7/20709; H05K 5/0213; H05K 7/20145; H05K 7/20572; H05K 7/1485; H05K 7/20718; H05K 5/00; H05K 7/1495; G06F 1/20; G06F 1/206; G06F 1/181; G06F 1/16; F28D 15/06; F28D 2021/0028
    See application file for complete search history.

(56) References Cited

U.S. PATENT DOCUMENTS

| | | | | |
|---|---|---|---|---|
| 8,180,495 B1* | 5/2012 | Roy | ................... | H05K 7/20836 165/67 |
| 8,628,158 B2* | 1/2014 | Caveney | ............ | H05K 7/20745 312/204 |
| 8,737,059 B2* | 5/2014 | Doerrich | ............ | H05K 7/20745 165/104.33 |
| 9,258,930 B2* | 2/2016 | Gardner | ............... | H05K 7/1497 |
| 2003/0050003 A1* | 3/2003 | Charron | ................ | F24F 3/0442 454/184 |
| 2004/0223300 A1* | 11/2004 | Fink | ......................... | H05K 7/20 361/690 |
| 2005/0248043 A1* | 11/2005 | Bettridge | .................. | F24F 9/00 261/27 |
| 2006/0139877 A1* | 6/2006 | Germagian | ........ | H05K 7/20745 361/695 |
| 2006/0260338 A1* | 11/2006 | VanGilder | ................. | G06F 1/20 62/259.2 |
| 2007/0076373 A1* | 4/2007 | Fink | ......................... | E04H 5/02 361/695 |
| 2008/0273306 A1* | 11/2008 | Campbell | .......... | H05K 7/20745 361/698 |
| 2009/0173473 A1* | 7/2009 | Day | ................... | H05K 7/20754 165/67 |
| 2009/0277605 A1* | 11/2009 | VanGilder | ................. | G06F 1/20 165/67 |
| 2012/0318492 A1* | 12/2012 | Keisling | ............ | H05K 7/20827 165/287 |
| 2013/0149954 A1* | 6/2013 | North | .................... | H05K 5/0213 454/184 |
| 2013/0267160 A1* | 10/2013 | Hung | .................. | H05K 7/20736 454/184 |
| 2014/0013827 A1* | 1/2014 | Bean, Jr. | ............ | H05K 7/20745 73/40.5 R |
| 2014/0059945 A1* | 3/2014 | Gardner | ............... | H05K 7/1497 52/64 |
| 2014/0238639 A1* | 8/2014 | Ambriz | .............. | H05K 7/20745 165/57 |

FOREIGN PATENT DOCUMENTS

| | | |
|---|---|---|
| CN | 203376620 | 1/2014 |
| CN | 103806704 | 5/2014 |
| WO | 2006124240 | 11/2006 |
| WO | 2009083052 | 7/2009 |

* cited by examiner

MODULAR DATA CENTER

CROSS-REFERENCE TO RELATED APPLICATION

This application is the U.S. national phase of PCT Application No. PCT/CN2014/092817 filed Dec. 2, 2014, which claims priority to Chinese Application No. 201410281149.1 filed Jun. 20, 2014, the disclosures of which are incorporated in their entirety by reference herein.

TECHNICAL FIELD

The present disclosure relates to a communication equipment technology, and more particularly to a modular data machine room.

BACKGROUND

A conventional data center usually relies on infrastructures such as a fixed building, and generally has the following two problems. First, time from requirement to construction completion is excessively long, and application requirements of a customer cannot be met. Second, the data machine room generally has a low cooling efficiency of refluxing and the like, which causes higher refrigeration loss and excessively high energy consumption of the data machine room.

SUMMARY

In order to solve the existing technical problems, an embodiment of the present disclosure provides a modular data machine room, which may solve the problems of long construction period and excessively high energy consumption.

In order to achieve the purpose, the technical solution of the embodiment of the present disclosure is implemented as follows.

The embodiment of the present disclosure provides a modular data machine room, which includes: a data cabinet subsystem, a cooling subsystem and a power distribution subsystem; herein the data cabinet subsystem includes two columns of data cabinet groups, and each column of data cabinet group includes at least one data cabinet;

the cooling subsystem includes at least one cooling unit, and the at least one cooling unit is arranged in the two columns of data cabinet groups;

each of the at least one data cabinet and the at least one cooling unit is provided with an interface connected with the power distribution subsystem, and is connected with the power distribution subsystem through the interface.

The modular data machine room further includes a sealing subsystem, and the sealing subsystem seals a channel between the two columns of data cabinet groups into a cold/hot channel.

In another embodiment, the sealing subsystem includes: a base, a door corresponding to the channel between the two columns of data cabinet groups and a top window corresponding to the channel between the two columns of data cabinet groups; and the base, the door and the top window seals the channel between the two columns of data cabinet groups into a cold/hot channel.

In another embodiment, the modular data machine room further includes a management and control subsystem, a firefighting subsystem, a wiring subsystem and a water distribution system; herein any four systems of the power distribution subsystem, the management and control subsystem, the firefighting subsystem, the wiring subsystem and the water distribution system are arranged at column heads and column tails of the two columns of data cabinet groups respectively; and the power distribution subsystem, the management and control subsystem, the firefighting subsystem, the wiring subsystem, the water distribution system, the cooling subsystem have a same height and depth as the data cabinets.

In another embodiment, the management and control subsystem includes a control cabinet, and the control cabinet includes a monitoring device, and monitoring data obtained by the monitoring device is displayed through a touch display screen.

In another embodiment, the firefighting subsystem includes a firefighting cabinet; and the firefighting cabinet includes a steel firefighting gas cylinder and a control box which controls a sensor in the modular data machine room; herein the sensor includes, but is not limited to, a temperature sensor and a smoke sensor.

In another embodiment, the wiring subsystem includes a wiring cabinet, and the wiring cabinet includes wiring equipment.

In another embodiment, an air inlet is arranged on a first side surface of the cooling unit; an air return port is arranged on a third side surface; and side air return ports are arranged on a second side surface and a fourth side surface; herein the first side surface and the third side surface are arranged opposite to each other, and the second side surface and the fourth side surface are arranged opposite to each other; and the first side surface is consistent with a front door of the at least one data cabinet in direction, and the third side surface is consistent with a rear door of the at least one data cabinet in direction, herein the front door is arranged on the first side surface of the data cabinet; and the rear door is arranged on the third side surface of the data cabinet.

In another embodiment, when the two columns of data cabinets are face to face and the at least one data cabinet is provided with a front door and rear door with a high opening ratio, the cooling unit selects to use the air inlet on the first side surface and the air return port on the third side surface to make the channel between the two columns of data cabinet groups form a cold channel.

In another embodiment, when the two columns of data cabinets are back to back and the at least one data cabinet is provided with a front door and rear door with a high opening ratio, the cooling unit selects to use the air inlet on the first side surface and the air return port on the third side surface to make the channel between the two columns of data cabinet groups form a hot channel.

In another embodiment, when the two columns of data cabinets are face to face and the at least one data cabinet is provided with a front door with a high opening ratio and a sealed rear door, the cooling unit selects to use the air inlet on the first side surface and the side air return ports on the second side surface and the fourth side surface to make the channel between the two columns of data cabinet groups form a cold channel.

According to the modular data machine room provided by the embodiments of the present disclosure, the modular data machine room includes: the data cabinet subsystem, the cooling subsystem and the power distribution subsystem; herein the data cabinet subsystem includes two columns of data cabinet groups, and each column of data cabinet group includes at least one data cabinet; the cooling subsystem includes the at least one cooling unit, and the at least one cooling unit is arranged in the two columns of data cabinet groups; each of the at least one data cabinet and the at least one cooling unit is provided with the interface connected with the power distribution subsystem, and is connected with the power distribution subsystem through the interface; and the modular data machine room further includes the sealing subsystem, and the sealing subsystem seals the channel between the two columns of data cabinet groups into the cold/hot channel. In such a manner, the number of the data cabinets may be increased or decreased according to a practical requirement, and a construction period is short, and application requirements of a customer are met. In addition, the sealing subsystem seals the channel between the two columns of data cabinet groups into the cold/hot channel, so that a cold airflow or hot airflow in the channel between the two columns of data cabinet groups is prevented from overflowing, and single circulation of the airflow is ensured, and airflow loss is avoided, and cooling efficiency is improved.

SPECIFIC EMBODIMENTS

The present disclosure will be further described in detail below in combination with the drawings and specific embodiments.

Embodiment One

Figure 1:
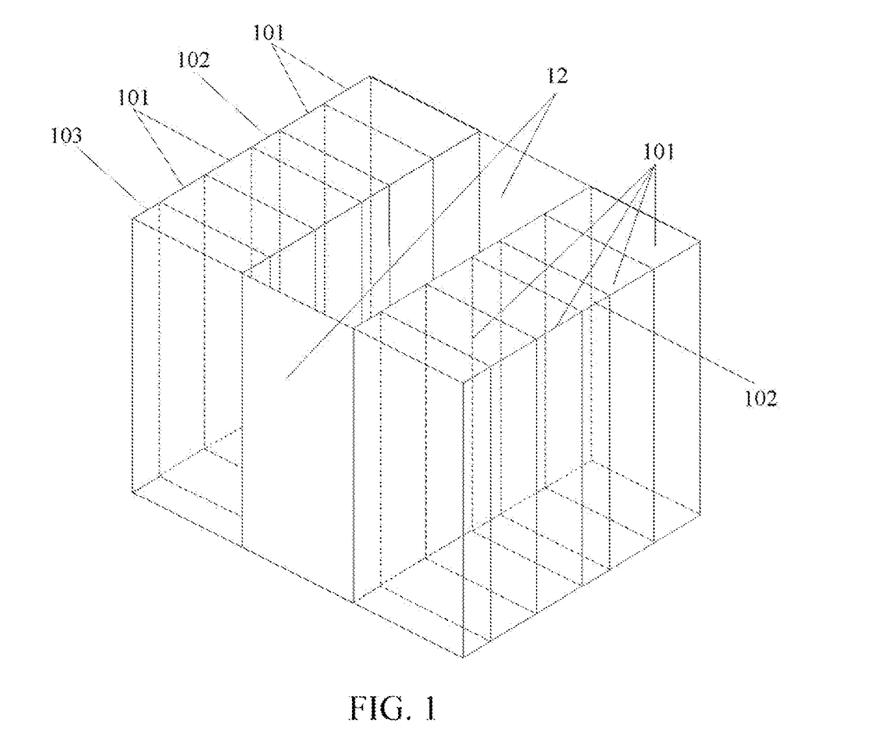
FIG. 1 is a front view of a modular data machine room according to embodiment one of the present disclosure.
Figure 2:
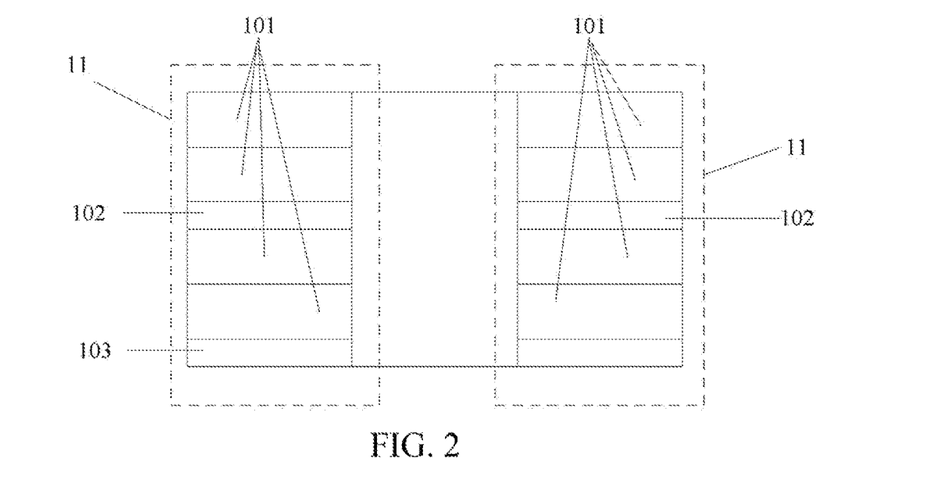
FIG. 2 is a top view of the modular data machine room according to embodiment one of the present disclosure.

An embodiment of the present disclosure provides a modular data machine room. FIG. 1 is a front view of a modular data machine room according to embodiment one of the present disclosure. FIG. 2 is a top view of the modular data machine room according to embodiment one of the present disclosure. As shown in FIG. 1 and FIG. 2, the modular data machine room includes: a data cabinet subsystem, a cooling subsystem and a power distribution subsystem 103. Herein, the data cabinet subsystem includes two columns of data cabinet groups 11, and each column of data cabinet group 11 includes at least one data cabinet 101;

the cooling subsystem includes at least one cooling unit 102, and the at least one cooling unit 102 is arranged in the two columns of data cabinet groups 11;

each of the at least one data cabinet 101 and the at least one cooling unit 102 is provided with an interface connected with the power distribution subsystem 103, and is connected with the power distribution subsystem 103 through the interface.

The modular data machine room further includes a sealing subsystem 12. The sealing subsystem 12 seals a channel between the two columns of data cabinet groups into a cold/hot channel.

Here, the sealing subsystem 12 seals the channel between the two columns of data cabinet groups 11, so that cold airflow or hot airflow in the channel between the two columns of data cabinet groups 11 is prevented from overflowing, and single circulation of the airflow is ensured, and airflow loss is avoided, and cooling efficiency is improved.

Here, the number of the data cabinets 101 may be flexibly arranged according to a practical requirement; and the number of the cooling units 102 is arranged according to overall power consumption of the modular data machine room.

A position of the cooling unit 102 may be flexibly selected. For example, the cooling units 102 are arranged at an interval of a preset number of data cabinets 101, and the preset number may be any positive integer.

The cooling unit 102 may adopt any water cooling type cooling device. Specifically, the cooling unit 102 may adopt a water cooling type, a direct expansion type or a coolant-cold water type, but is not limited to the abovementioned manners.

In the embodiment, the two columns of data cabinets in the two columns of data cabinet groups 11 may be arranged face to face, and may also be arranged back to back. By selecting to use different materials for front and rear doors of the data cabinets in the two columns of data cabinet groups 11 and selecting to use different air supplying manners for the cooling unit 102, the channel between the two columns of data cabinet groups forms a cold channel or a hot channel.

Herein, the data cabinets 101, the cooling unit 102 and the power distribution subsystem 103 have the same height and depth, and the data cabinets 101, the cooling unit 102 and the power distribution subsystem 103 may have different widths, so that the modular data machine room can be flexibly mounted. The numbers of the data cabinets 101 and the cooling units 102 in the modular data machine room may be flexibly increased or decreased according to different requirements. For example, each data cabinet 101 has a depth of 1,200 mm and a width of 600 mm; the cooling unit 102 has a depth of 1,200 mm and a width of 300 mm or 600 mm; the power distribution subsystem 103 has a depth of 1,200 mm and a width of 300 mm; and the height of the data cabinets 101, the cooling unit 102 and the power distribution subsystem 103 may be customized, for example, to be 2 m and 2.2 m, according to a requirement.

Embodiment Two

Figure 3:
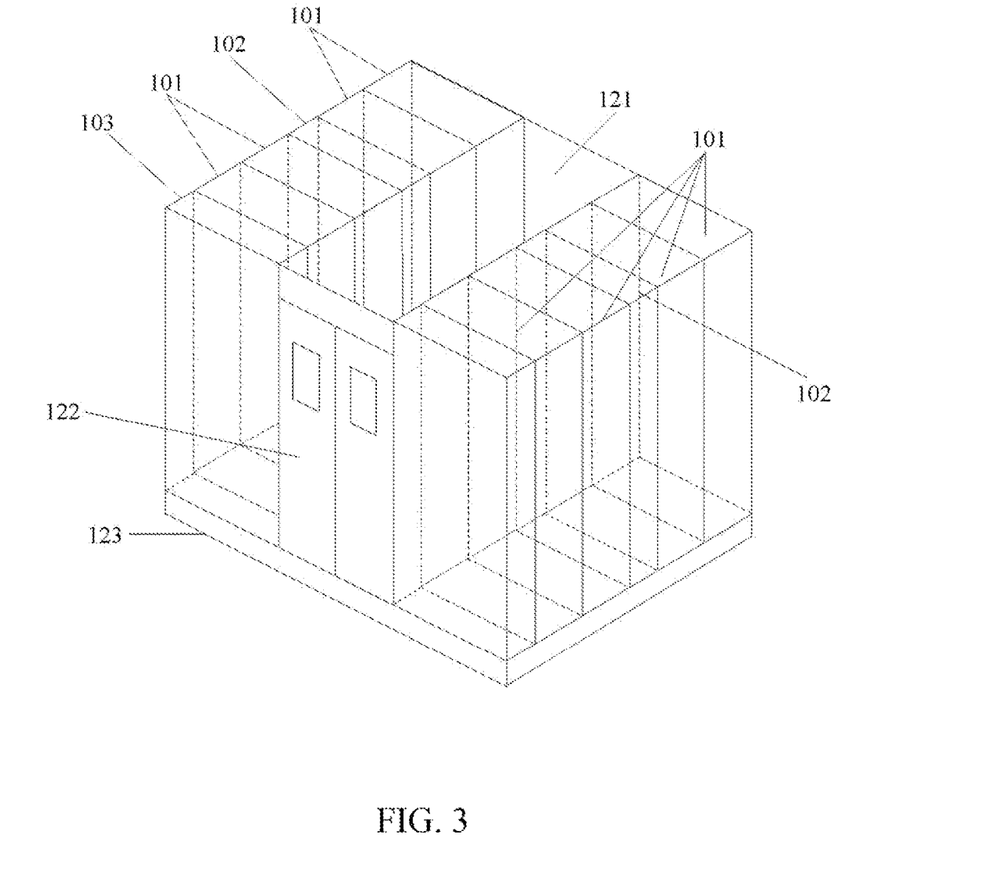
FIG. 3 is a schematic diagram of a modular data machine room according to embodiment two of the present disclosure.

An embodiment of the present disclosure further provides a modular data machine room. FIG. 3 is a schematic diagram of a modular data machine room according to embodiment two of the present disclosure. In combination with FIG. 2 and FIG. 3, the modular data machine room includes: a data cabinet subsystem, a cooling subsystem and a power distribution subsystem 103. Herein, the data cabinet subsystem includes two columns of data cabinet groups 11, and each column of data cabinet group 11 includes at least one data cabinet 101;

the cooling subsystem includes at least one cooling unit 102, and the at least one cooling unit 102 is arranged in the two columns of data cabinet groups 11;

each of the at least one data cabinet 101 and the at least one cooling unit 102 is provided with an interface connected with the power distribution subsystem 103, and is connected with the power distribution subsystem 103 through the interface.

The modular data machine room further includes a sealing subsystem 12. The sealing subsystem 12 includes: a base 123, a door 122 corresponding to the channel between the two columns of data cabinet groups 11 and a top window 121 corresponding to the channel between the two columns of data cabinet groups 11. The base 123, the door 122 and the top window 121 seal the channel between the two columns of data cabinet groups 11 into a cold/hot channel.

Here, the sealing subsystem 12 seals the channel between the two columns of data cabinet groups 11, so that a cold airflow or hot airflow in the channel between the two columns of data cabinet groups 11 is prevented from overflowing, and single circulation of the airflow is ensured, and airflow loss is avoided, and cooling efficiency is improved.

Here, the number of the data cabinets 101 may be flexibly arranged according to a practical requirement; and the number of the cooling units 102 is arranged according to overall power consumption of the modular data machine room.

A position of the cooling unit 102 may be flexibly selected. For example, the cooling units 102 are arranged at an interval of a preset number of data cabinets 101, and the preset number may be any positive integer.

The cooling unit 102 may adopt any water cooling type cooling device. Specifically, the cooling unit 102 may adopt a water cooling type, a direct expansion type or a coolant-cold water type, but is not limited to the above manners.

In the embodiment, the two columns of data cabinets in the two columns of data cabinet groups 11 may be arranged face to face, and may also be arranged back to back. By selecting to use different materials for front and rear doors of the data cabinets in the two columns of data cabinet groups 11 and selecting to use different air supplying manners for the cooling unit 102, the channel between the two columns of data cabinet groups forms a cold channel or a hot channel.

Herein, the data cabinets 101, the cooling unit 102 and the power distribution subsystem 103 all have the same height and depth, and the data cabinets 101, the cooling unit 102 and the power distribution subsystem 103 may have different widths, so that the modular data machine room can be flexibly mounted. The numbers of the data cabinets 101 and the cooling units 102 in the modular data machine room may be flexibly increased or decreased according to different requirements. For example, each data cabinet 101 has a depth of 1,200 mm and a width of 600 mm; the cooling unit 102 has a depth of 1,200 mm and a width of 300 mm or 600 mm; the power distribution subsystem 103 has a depth of 1,200 mm and a width of 300 mm; and the height of the data cabinets 101, the cooling unit 102 and the power distribution subsystem 103 may be customized, for example, to be 2 m and 2.2 m, according to a requirement.

In the embodiment, the door 122 has the same height, for example, 2 m in the abovementioned example, as the data cabinet 101, the cooling unit 102 or the power distribution subsystem 103. The top window 121 corresponds to a size of the channel between the two columns of data cabinet groups 11; and the base 123 corresponds to a size of the modular data machine room. Specifically, the base 123 may be pre-arranged, and then the data cabinets 101, the cooling unit 102 and the power distribution subsystem 103 in the modular data machine room are mounted on the base 123 according to a preset mounting rule.

Embodiment Three

Figure 4:
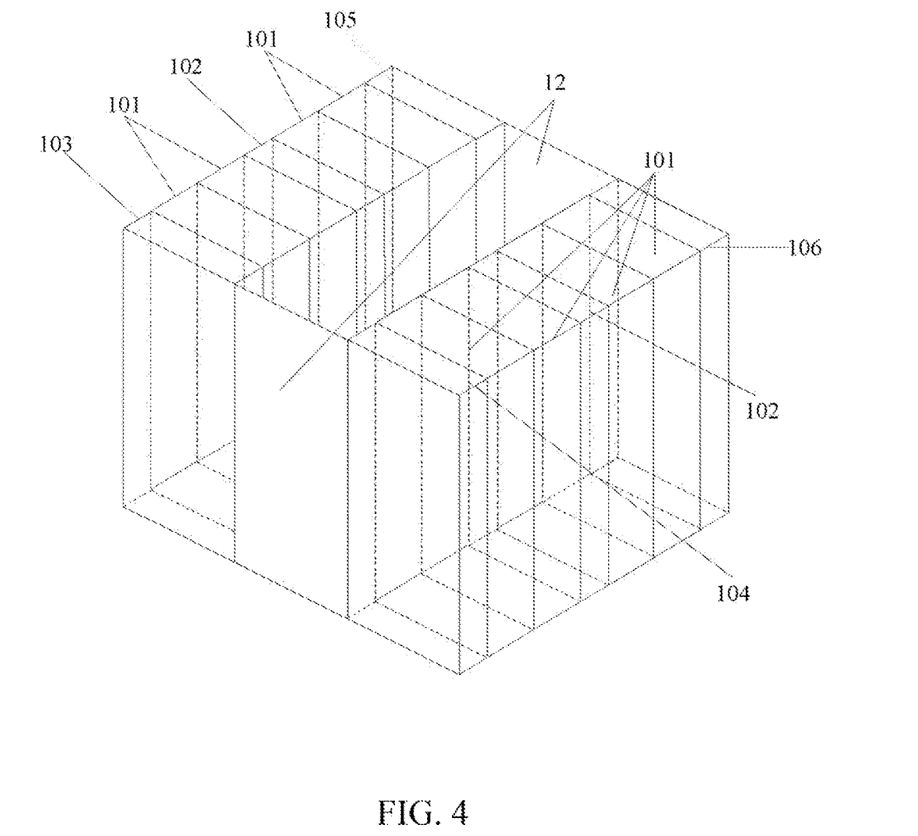
FIG. 4 is a front view of a modular data machine room according to embodiment three of the present disclosure.

An embodiment of the present disclosure provides a modular data machine room. FIG. 4 is a front view of a modular data machine room according to embodiment three of the present disclosure. As shown in FIG. 4, the modular data machine room includes: a data cabinet subsystem, a cooling subsystem and a power distribution subsystem. Herein, the data cabinet subsystem includes two columns of data cabinet groups, and each column of data cabinet group includes at least one data cabinet 101;

the cooling subsystem includes at least one cooling unit 102, and the at least one cooling unit 102 is arranged in the two columns of data cabinet groups;

each of the at least one data cabinet 101 and the at least one cooling unit 102 is provided with an interface connected with the power distribution subsystem, and is connected with the power distribution subsystem through the interface.

The modular data machine room further includes a sealing subsystem 12. The sealing subsystem 12 seals a channel between the two columns of data cabinet groups into a cold/hot channel.

The modular data machine room further includes a management and control subsystem, a firefighting subsystem, a wiring subsystem and a water distribution system. Herein, any four systems of the power distribution subsystem, the management and control subsystem, the firefighting subsystem, the wiring subsystem and the water distribution system are arranged at column heads and column tails of the two columns of data cabinet groups respectively.

The power distribution subsystem, the management and control subsystem, the firefighting subsystem, the wiring subsystem, the water distribution system, the cooling subsystem have a same height and depth as the data cabinets.

In an implementation mode, the modular data machine room may select to arrange the power distribution subsystem, the management and control subsystem, the firefighting subsystem and the wiring subsystem at the column heads and column tails of the two columns of data cabinet groups respectively, and arrange the water distribution system at any position in the two columns of data cabinet groups. Specifically, as shown in FIG. 4, the power distribution subsystem 103 is arranged at the column head of the first column of data cabinet group, and the management and control subsystem 104 is arranged at the column head of the second column of data cabinet group; and the wiring subsystem 105 is arranged at the column tail of the first column of data cabinet group; and the firefighting subsystem 106 is arranged at the column tail of the second column of data cabinet group.

In the embodiment, the management and control subsystem includes a control cabinet, and the control cabinet includes a monitoring device, and monitoring data obtained by the monitoring device is displayed through a touch display screen.

Specifically, a monitoring host machine and the touch display screen are arranged in the control cabinet. The monitoring host machine includes a related logic program for management and control. The monitoring host machine is connected with various sensors in the modular data machine room, and the sensors include, for example, a temperature sensor which monitors temperature of the data cabinet 101. Various items of data monitored by the monitoring host machine may be displayed through the touch display screen.

In the embodiment, the firefighting subsystem includes a firefighting cabinet. The firefighting cabinet includes a steel firefighting gas cylinder and a control box which controls a sensor in the modular data machine room. Herein, the sensor includes, but is not limited to, a temperature sensor and a smoke sensor.

Specifically, the control box is used for controlling the sensor, such as the smoke sensor, in the modular data machine room. When the smoke sensor detects that smoke content exceeds a preset threshold value, the firefighting subsystem may trigger a smoke alarm and start/stop a sprinkler through the control box.

In the embodiment, the wiring subsystem includes a wiring cabinet, and the wiring cabinet includes wiring equipment.

Specifically, the wiring equipment is network wiring equipment, and the network wiring equipment is used for converging network cables.

In the embodiment, the water distribution system is used to distribute a cooling water resource of the cooling unit 102 in the modular data machine room.

Here, the sealing subsystem 12 seals the channel between the two columns of data cabinet groups 11, so that a cold airflow or hot airflow in the channel between the two columns of data cabinet groups 11 is prevented from overflowing, and single circulation of the airflow is ensured, and airflow loss is avoided, and cooling efficiency is improved.

Here, the number of the data cabinets 101 may be flexibly arranged according to a practical requirement; and the number of the cooling units 102 is arranged according to overall power consumption of the modular data machine room. For example, when the overall power consumption of the modular data machine room is 6 kW and cooling power consumption of each cooling unit 102 is 3 kW, totally two cooling units 102 are required by the modular data machine room.

A position of the cooling unit 102 may be flexibly selected. For example, the cooling units 102 are arranged at an interval of a preset number of data cabinets 101, and the preset number may be any positive integer.

The cooling unit 102 may adopt any water cooling type cooling device. Specifically, the cooling unit 102 may adopt a water cooling type, a direct expansion type or a coolant-cold water type, but is not limited to the above manners.

In the embodiment, the two columns of data cabinet group in the two columns of data cabinet groups 11 may be arranged face to face, and may also be arranged back to back. By adopting different materials for front and rear doors of the data cabinets in the two columns of data cabinet groups 11 and adopting different air supplying manners for the cooling unit 102, the channel between the two columns of data cabinet groups forms a cold channel or a hot channel.

Embodiment Four

Figure 5:
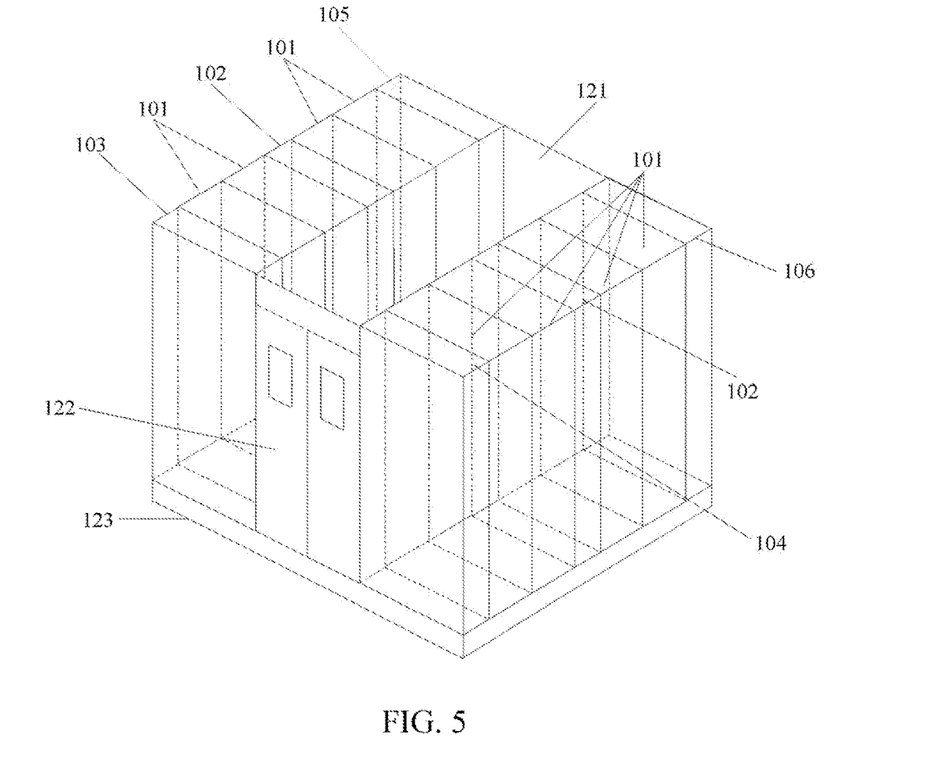
FIG. 5 is a front view of a modular data machine room according to embodiment four of the present disclosure.
Figure 6:
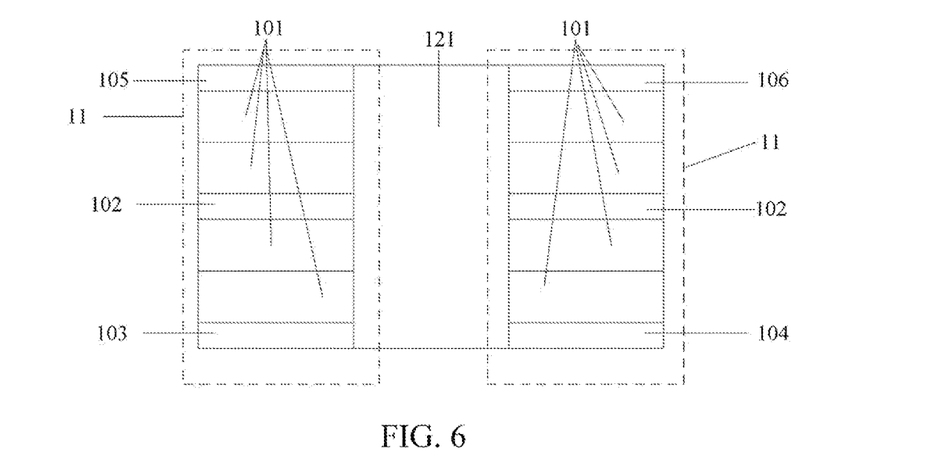
FIG. 6 is a top view of the modular data machine room according to embodiment four of the present disclosure.

An embodiment of the present disclosure provides a modular data machine room. FIG. 5 is a front view of a modular data machine room according to embodiment four of the present disclosure. FIG. 6 is a top view of the modular data machine room according to embodiment four of the present disclosure. As shown in FIG. 5 and FIG. 6, the modular data machine room includes: a data cabinet subsystem, a cooling subsystem and a power distribution subsystem 103. Herein, the modular data machine room includes: the data cabinet subsystem, the cooling subsystem and the power distribution subsystem 103, herein, the data cabinet subsystem includes two columns of data cabinet groups 11, and each column of data cabinet group 11 includes at least one data cabinet 101;

the cooling subsystem includes at least one cooling unit 102, and the at least one cooling unit 102 is arranged in the two columns of data cabinet groups 11;

each of the at least one data cabinet 101 and the at least one cooling unit 102 is provided with an interface connected with the power distribution subsystem 103, and is connected with the power distribution subsystem 103 through the interface.

The modular data machine room further includes a sealing subsystem 12. The sealing subsystem 12 includes: a base 123, a door 122 corresponding to the channel between the two columns of data cabinet groups 11 and a top window 121 corresponding to the channel between the two columns of data cabinet groups 11. The base 123, the door 122 and the top window 121 seal the channel between the two columns of data cabinet groups 11 into a cold/hot channel.

The modular data machine room further includes a management and control subsystem, a firefighting subsystem, a wiring subsystem and a water distribution system. Herein, any four systems of the power distribution subsystem, the management and control subsystem, the firefighting subsystem, the wiring subsystem and the water distribution system are arranged at column heads and column tails of the two columns of data cabinet groups respectively.

The power distribution subsystem, the management and control subsystem, the firefighting subsystem, the wiring subsystem, the water distribution system, the cooling subsystem have a same height and depth as the data cabinets.

In an implementation mode, the modular data machine room may select to arrange the power distribution subsystem, the management and control subsystem, the firefighting subsystem and the wiring subsystem at the column heads and column tails of the two columns of data cabinet groups respectively, and arrange the water distribution system at any position in the two columns of data cabinet groups. Specifically, as shown in FIG. 4, the power distribution subsystem 103 is arranged at the column head of the first column of data cabinet group, and the management and control subsystem 104 is arranged at the column head of the second column of data cabinet group; the wiring subsystem 105 is arranged at the column tail of the first column of data cabinet group; and the firefighting subsystem 106 is arranged at the column tail of the second column of data cabinet group.

In the embodiment, the management and control subsystem includes a control cabinet, and the control cabinet includes a monitoring device, and monitoring data obtained by the monitoring device is displayed through a touch display screen.

Specifically, a monitoring host machine and the touch display screen are arranged in the control cabinet. The monitoring host machine includes a related logic program for management control. The monitoring host machine is connected with various sensors in the modular data machine room, and the sensors include, for example, a temperature sensor which monitors temperature of the data cabinets 101. Various items of data monitored by the monitoring host machine may be displayed through the touch display screen. The monitoring host machine is further used for monitoring access control of the door 122. Specifically, a user can enter the modular data machine room only after passing a door access acknowledgement or identification preset by the monitoring host machine.

In the embodiment, the firefighting subsystem includes a firefighting cabinet. The firefighting cabinet includes a steel firefighting gas cylinder and a control box which controls a sensor in the modular data machine room. Herein, the sensor includes, but is not limited to, a temperature sensor and a smoke sensor.

Specifically, the control box is used to control the sensor, such as the smoke sensor, in the modular data machine room. When the smoke sensor detects that smoke content exceeds a preset threshold value, the firefighting subsystem may trigger a smoke alarm and start/stop a sprinkler through the control box.

In the embodiment, the wiring subsystem includes a wiring cabinet, and the wiring cabinet includes wiring equipment.

Specifically, the wiring equipment is network wiring equipment, and the network wiring equipment is used for converging network cables.

In the embodiment, the water distribution system is used to distribute a cooling water resource of the cooling unit 102 in the modular data machine room.

Here, the sealing subsystem 12 seals the channel between the two columns of data cabinet groups 11, so that a cold airflow or hot airflow in the channel between the two columns of data cabinet groups 11 is prevented from overflowing, and single circulation of the airflow is ensured, and airflow loss is avoided, and cooling efficiency is improved.

Here, the number of the data cabinets 101 may be flexibly arranged according to a practical requirement. The number of the cooling units 102 is arranged according to overall power consumption of the modular data machine room. For example, when the overall power consumption of the modular data machine room is 6 kW and cooling power of each cooling unit 102 is 3 kW, totally two cooling units 102 are required by the modular data machine room.

A position of the cooling unit 102 may be flexibly selected. For example, the cooling units 102 are arranged at an interval of a preset number of data cabinets 101, and the preset number may be any positive integer.

The cooling unit 102 may adopt any water cooling type cooling device. Specifically, the cooling unit 102 may adopt a water cooling type, a direct expansion type or a coolant-cold water type, but is not limited to the abovementioned manners.

In the embodiment, the two columns of data cabinets in the two columns of data cabinet groups 11 may be arranged face to face, and may also be arranged back to back. By adopting different materials for front and rear doors of the data cabinets in the two columns of data cabinet groups 11 and adopting different air supplying manners for the cooling unit 102, the channel between the two columns of data cabinet groups forms a cold channel or a hot channel.

Embodiment Five

An embodiment of the present disclosure provides a modular data machine room. As shown in FIG. 1 and FIG. 2, the modular data machine room includes: a data cabinet subsystem, a cooling subsystem and a power distribution subsystem 103. Herein, the data cabinet subsystem includes two columns of data cabinet groups 11, and each column of data cabinet group 11 includes at least one data cabinet 101;

the cooling subsystem includes at least one cooling unit 102, and the at least one cooling unit 102 is arranged in the two columns of data cabinet groups 11;

each of the at least one data cabinet 101 and the at least one cooling unit 102 is provided with an interface connected with the power distribution subsystem 103, and is connected with the power distribution subsystem 103 through the interface.

The modular data machine room further includes a sealing subsystem 12, and the sealing subsystem 12 seals a channel between the two columns of data cabinet groups into a cold/hot channel.

In the embodiment, the two columns of data cabinets in the two columns of data cabinet groups 11 may be arranged face to face, and may also be arranged back to back. By adopting different materials for front and rear doors of the data cabinets in the two columns of data cabinet groups 11 and adopting different air supplying manners for the cooling unit 102, the channel between the two columns of data cabinet groups forms a cold channel or a hot channel.

Here, the sealing subsystem 12 seals the channel between the two columns of data cabinet groups 11, so that a cold airflow or hot airflow in the channel between the two columns of data cabinet groups 11 is prevented from overflowing, and single circulation of the airflow is ensured, and airflow loss is avoided, and cooling efficiency is improved.

Here, a position of the cooling unit 102 may be flexibly selected. For example, the cooling units 102 are arranged at an interval of a preset number of data cabinets 101, and the preset number may be any positive integer.

The cooling unit 102 may adopt any water cooling type cooling device. Specifically, the cooling unit 102 may adopt a water cooling type, a direct expansion type or a coolant-cold water type, but is not limited to the abovementioned manners.

Figure 7:
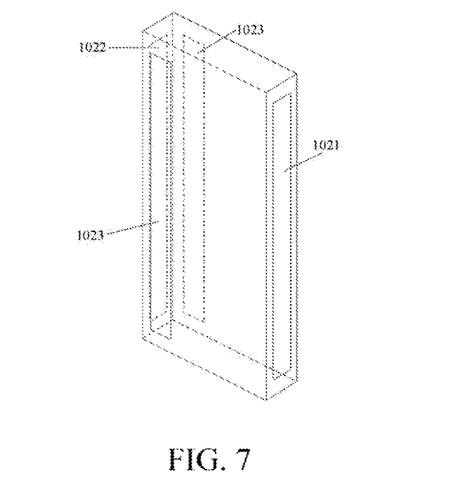
FIG. 7 is a front view of a cooling unit according to embodiment five of the present disclosure.

FIG. 7 is a front view of a cooling unit according to embodiment five of the present disclosure. As shown in FIG. 7, an air inlet 1021 is arranged on a first side surface of the cooling unit 102; an air return port 1022 is arranged on a third side surface; and side air return ports 1023 are arranged in a second side surface and a fourth side surface. Herein, the first side surface and the third side surface are arranged opposite to each other, and the second side surface and the fourth side surface are arranged opposite to each other. The first side surface is consistent with a front door of the at least one data cabinet in direction, and the third side surface is consistent with a rear door of the at least one data cabinet in direction. The front door is arranged on a first side surface of the data cabinet; and the rear door is arranged on a third side surface of the data cabinet.

Figure 8:
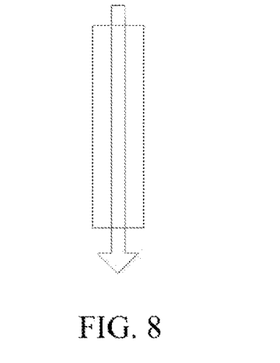
FIG. 8 is a schematic diagram of an airflow direction of a cooling unit according to an embodiment of the present disclosure.

FIG. 8 is a schematic diagram of an airflow direction of a cooling unit according to an embodiment of the present disclosure. When the cooling unit 102 selects to use the air inlet 1021 on the first side surface and the air return port 1022 on the third side surface, a direction of airflow flowing through the cooling unit 102 is shown in FIG. 8. A cold airflow generated by the cooling unit 102 flows out of the air inlet 1021, and a hot airflow flows into the cooling unit 102 from the air return port 1022.

Figure 9:
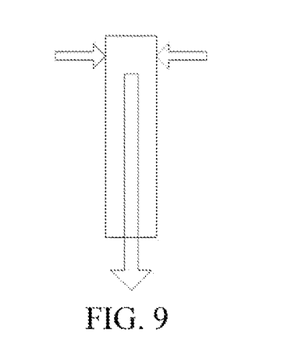
FIG. 9 is a schematic diagram of another airflow direction of the cooling unit according to an embodiment of the present disclosure.

FIG. 9 is a schematic diagram of another airflow direction of a cooling unit according to an embodiment of the present disclosure. When the cooling unit 102 selects to use the air inlet 1021 on the first side surface and the side air return ports 1023 on the second side surface and the fourth side surface, a direction of airflow flowing through the cooling unit 102 is shown in FIG. 9. The cold airflow generated by the cooling unit 102 flows out of the air inlet 1021, and the hot airflow flows into the cooling unit 102 from the side air return ports 1023 in the second side surface and the fourth side surface.

When the cooling unit 102 is in different directions and selects to use abovementioned different air return modes, airflow directions in the modular data machine room are also different, and may specifically include the following three examples.

Example One

When the two columns of data cabinets are face to face and the at least one data cabinet is provided with a front door and rear door with a high opening ratio, the cooling unit selects to use the air inlet in the first side surface and the air return port in the third side surface to make the channel between the two columns of data cabinet groups form a cold channel.

Figure 10:
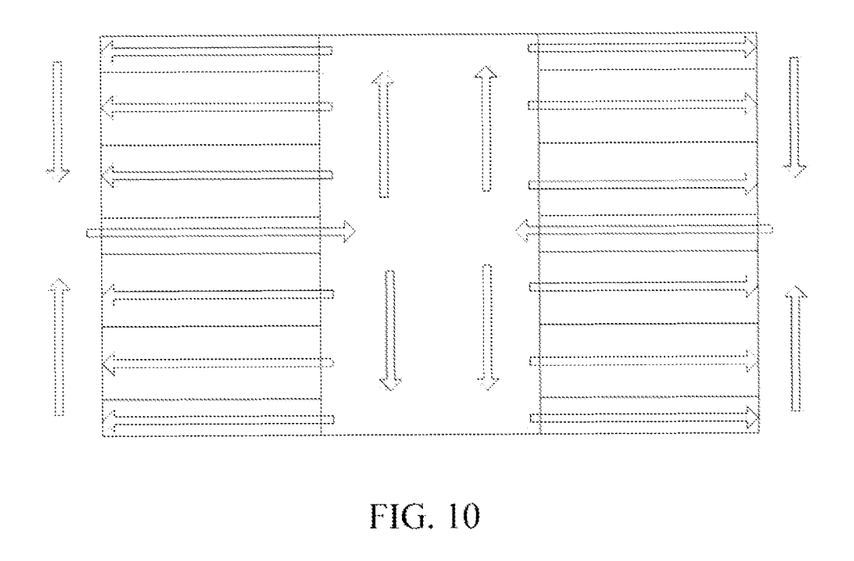
FIG. 10 is a schematic diagram of a first air flowing direction according to an embodiment of the present disclosure.

Specifically, FIG. 10 is a schematic diagram of a first air flowing direction according to an embodiment of the present disclosure. As shown in FIG. 10, the cold airflow flows into the channel between the two columns of data cabinet groups from the air inlet, and enters the data cabinets from the front doors of the data cabinets, and the hot airflow is discharged from the rear doors of the data cabinets after heat of the data cabinets is carried by the cold airflow. The hot airflow is sucked into the air return port of the cooling unit, and through cooling of the cooling unit, the cold airflow is discharged from the air inlet. Thereby, a cold channel sealing mode is formed.

Example Two

When the two columns of data cabinets are back to back and the at least one data cabinet is provided with a front door and rear door with a high opening ratio, the cooling unit selects to use the air inlet on the first side surface and the air return port in the third side surface to make the channel between the two columns of data cabinet groups form a hot channel.

Figure 11:
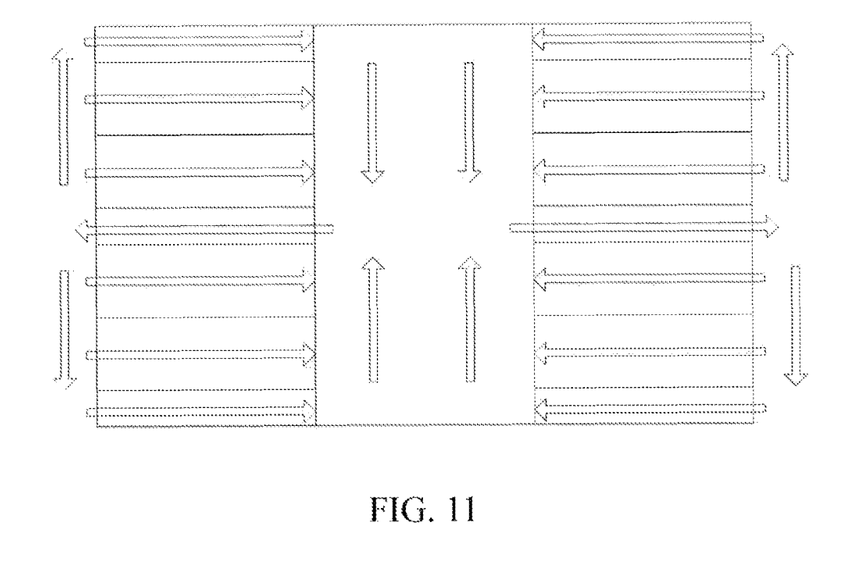
FIG. 11 is a schematic diagram of a second air flowing direction according to an embodiment of the present disclosure.

Specifically, FIG. 11 is a schematic diagram of a second air flowing direction according to an embodiment of the present disclosure. As shown in FIG. 11, the cold airflow flows into an external environment from the air inlet, and the cold airflow is sucked into the front doors of the data cabinets, and the hot airflow is discharged into the channel between the two columns of data cabinet groups from the rear doors of the data cabinets after heat of the data cabinets is carried by the cold airflow. The hot airflow is sucked into the air return port of the cooling unit, and through cooling of the cooling unit, the cold airflow is discharged from the air inlet. Thereby, a hot channel sealing mode is formed.

Example Three

When the two columns of data cabinets are face to face and the at least one data cabinet is provided with a front door with a high opening ratio and a sealed rear door, the cooling unit selects to use the air inlet on the first side surface and the side air return ports on the second side surface and the fourth side surface to make the channel between the two columns of data cabinet groups form a cold channel.

Figure 12:
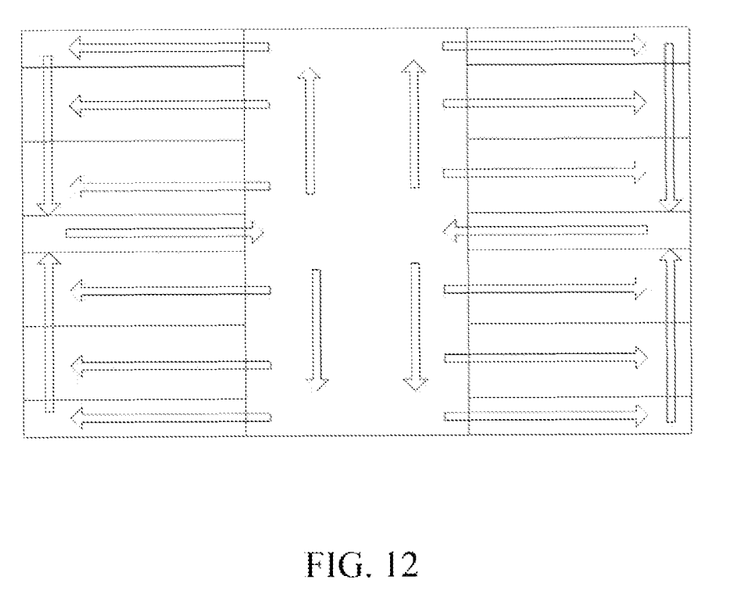
FIG. 12 is a schematic diagram of a third air flowing direction according to an embodiment of the present disclosure.

Specifically, FIG. 12 is a schematic diagram of a third air flowing direction according to an embodiment of the present disclosure. As shown in FIG. 12, the cold airflow flows into the channel between the two columns of data cabinet groups from the air inlet, and enters the data cabinets from the front doors of the data cabinets, and the hot airflow is discharged from the rear doors of the data cabinets after heat of the data cabinets is carried by the cold airflow. The hot airflow is sucked into the side air return ports of the cooling unit, and through cooling of the cooling unit, the cold airflow is discharged from the air inlet. Thereby, a cold channel sealing mode is formed.

The above is only the implementation modes of the embodiments of the present disclosure. It should be pointed out that those ordinary skilled in the art may further make a plurality of improvements and embellishments without departing from the principle of the embodiments of the present disclosure, and these improvements and embellishments shall also fall within the scope of protection of the embodiments of the present disclosure.

INDUSTRIAL APPLICABILITY

According to the modular data machine room provided by the embodiments of the present disclosure, the number of the data cabinets may be increased or decreased according to a practical requirement, and a construction period of the modular data machine room is short, and application requirements of a customer are met. In addition, the sealing subsystem seals the channel between the two columns of data cabinet groups into the cold/hot channel, so that the cold airflow or hot airflow in the channel between the two columns of data cabinet groups is prevented from overflowing, and single circulation of the airflow is ensured, and airflow loss is avoided, and cooling efficiency is improved.

What we claim is:

1. A modular data machine room, comprising: a data cabinet subsystem, a cooling subsystem and a power distribution subsystem; wherein
   the data cabinet subsystem comprises two columns of data cabinet groups, and each column of data cabinet group comprises at least one data cabinet;
   the cooling subsystem comprises at least one cooling unit, and the at least one cooling unit is arranged in the two columns of data cabinet groups;
   each of the at least one data cabinet and the at least one cooling unit is provided with an interface connected with the power distribution subsystem, and is connected with the power distribution subsystem through the interface; and
   the modular data machine room further comprises a sealing subsystem, and the sealing subsystem seals a channel between the two columns of data cabinet groups into a cold/hot channel,
   wherein an air inlet is arranged on a first side surface of the cooling unit; an air return port is arranged on a third side surface; and side air return ports are arranged in a second side surface and a fourth side surface, wherein the first side surface and the third side surface are arranged opposite to each other, and the second side surface and the fourth side surface are arranged opposite to each other; and the first side surface is consistent with a front door of the at least one data cabinet in direction, and the third side surface is consistent with a rear door of the at least one data cabinet in direction, wherein the front door is arranged on the first side surface of the data cabinet; and the rear door is arranged on the third side surface of the data cabinet, wherein when the two columns of data cabinets are face to face and the at least one data cabinet is provided with a front door and rear door with a high opening ratio, the cooling unit selects to use the air inlet on the first side surface and the air return port on the third side surface to make the channel between the two columns of data cabinet groups form a cold channel, or when the two columns of data cabinets are back to back and the at least one data cabinet is provided with a front door and rear door with a high opening ratio, the cooling unit selects to use the air inlet on the first side surface and the air return port on the third side surface to make the channel between the two columns of data cabinet groups form a hot channel, or when the two columns of data cabinets are face to face and the at least one data cabinet is provided with a front door with a high opening ratio and a sealed rear door, the cooling unit selects to use the air inlet on the first side surface and the side air return ports on the second side surface and the fourth side surface to make the channel between the two columns of data cabinet groups form a cold channel.

2. The modular data machine room according to claim 1, wherein the sealing subsystem comprises: a base, a door corresponding to the channel between the two columns of data cabinet groups and a top window corresponding to the channel between the two columns of data cabinet groups, and the base, the door and the top window seal the channel between the two columns of data cabinet groups into the cold/hot channel.

3. The modular data machine room according to claim 1, wherein, the modular data machine room further comprises a management and control subsystem, a firefighting subsystem, a wiring subsystem and a water distribution system; wherein
  any four systems of the power distribution subsystem, the management and control subsystem, the firefighting subsystem, the wiring subsystem and the water distribution system are arranged at column heads and column tails of the two columns of data cabinet groups respectively; and
  the power distribution subsystem, the management and control subsystem, the firefighting subsystem, the wiring subsystem, the water distribution system, the cooling subsystem have a same height and depth as the data cabinets.

4. The modular data machine room according to claim 3, wherein the management and control subsystem comprises a control cabinet, and the control cabinet comprises a monitoring device, and monitoring data obtained by the monitoring device is displayed through a touch display screen.

5. The modular data machine room according to claim 3, wherein the firefighting subsystem comprises a firefighting cabinet; and the firefighting cabinet comprises a steel firefighting gas cylinder and a control box which controls a sensor in the modular data machine room; wherein the sensor comprises, but is not limited to, a temperature sensor and a smoke sensor.

6. The modular data machine room according to claim 3, wherein the wiring subsystem comprises a wiring cabinet, and the wiring cabinet comprises wiring equipment.

* * * * *